(12) United States Patent
Kuno

(10) Patent No.: US 12,106,994 B2
(45) Date of Patent: Oct. 1, 2024

(54) ELECTROSTATIC CHUCK

(71) Applicant: NGK Insulators, Ltd., Nagoya (JP)

(72) Inventor: Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 197 days.

(21) Appl. No.: 17/933,153

(22) Filed: Sep. 19, 2022

(65) Prior Publication Data

US 2023/0019439 A1    Jan. 19, 2023

Related U.S. Application Data

(63) Continuation of application No. PCT/JP2021/009255, filed on Mar. 9, 2021.

(30) Foreign Application Priority Data

May 25, 2020    (JP) .................................. 2020-090932

(51) Int. Cl.
| | | |
|---|---|---|
| *H01L 21/683* | (2006.01) | |
| *H01J 37/32* | (2006.01) | |
| *H01L 21/687* | (2006.01) | |

(52) U.S. Cl.
CPC ...... *H01L 21/6833* (2013.01); *H01J 37/3244* (2013.01); *H01J 37/32724* (2013.01); *H01L 21/68757* (2013.01); *H01L 21/68785* (2013.01)

(58) Field of Classification Search
CPC .............. H01L 21/6833; H01J 37/3244; H01J 37/32724
See application file for complete search history.

(56) References Cited

U.S. PATENT DOCUMENTS

| | | | |
|---|---|---|---|
| 5,748,435 A | 5/1998 | Parkhe | |
| 8,696,862 B2 * | 4/2014 | Sasaki | ................. H01L 21/6831 118/724 |

(Continued)

FOREIGN PATENT DOCUMENTS

| | | |
|---|---|---|
| JP | H10-275854 A | 10/1998 |
| JP | 2003-068834 A | 3/2003 |

(Continued)

OTHER PUBLICATIONS

International Search Report and Written Opinion (Application No. PCT/JP2021/009255) dated Apr. 20, 2021 (with English translation).

(Continued)

*Primary Examiner* — Scott Bauer
(74) *Attorney, Agent, or Firm* — BURR PATENT LAW, PLLC

(57) ABSTRACT

An electrostatic chuck includes: a disk-shaped ceramic plate having a wafer placement surface on a surface thereof; an electrostatic electrode embedded in the ceramic plate; and gas grooves that are divided in a plurality of zones when the ceramic plate is seen from above and each of which is independently provided in the wafer placement surface so as to extend from one to the other of a pair of gas supply/discharge openings for a corresponding one of the zones. A pattern in which a gas is supplied to each of the gas grooves provided for a corresponding one of the zones is selectable between a first pattern in which the gas flows from one to the other of the pair of gas supply/discharge openings and a second pattern in which the gas flows from the other to the one of the pair of gas supply/discharge openings.

10 Claims, 9 Drawing Sheets

(56) References Cited

U.S. PATENT DOCUMENTS

| | | | |
|---|---|---|---|
| 11,450,538 B2* | 9/2022 | Tamura | H01L 21/67109 |
| 2002/0135968 A1 | 9/2002 | Chen | |
| 2008/0138535 A1* | 6/2008 | Hwang | H01J 37/32788 |
| | | | 118/710 |
| 2009/0194264 A1 | 8/2009 | Sasaki | |
| 2014/0008020 A1* | 1/2014 | Nagayama | H01J 37/32091 |
| | | | 137/2 |
| 2016/0141191 A1 | 5/2016 | Blake | |
| 2020/0118800 A1 | 4/2020 | Lee et al. | |

FOREIGN PATENT DOCUMENTS

| | | |
|---|---|---|
| JP | 2005-079415 A | 3/2005 |
| JP | 2006-344670 A | 12/2006 |
| JP | 2009-188162 A | 8/2009 |
| JP | 2010-141081 A | 6/2010 |
| JP | 2012-129547 A | 7/2012 |
| JP | 2018-503969 A | 2/2018 |
| JP | 2020-068350 A | 4/2020 |

OTHER PUBLICATIONS

English translation of the International Preliminary Report on Patentability (Chapter I) dated Dec. 8, 2022 (Application No. PCT/JP2021/009255).

\* cited by examiner

ELECTROSTATIC CHUCK

BACKGROUND OF THE INVENTION

1. Field of the Invention

The present invention relates to an electrostatic chuck.

2. Description of the Related Art

To date, an electrostatic chuck including a disk-shaped ceramic plate having a wafer placement surface on a surface thereof and an electrostatic electrode embedded in the ceramic plate is known. Among electrostatic chucks of this type, an electrostatic chuck having gas grooves provided in the wafer placement surface is known, as described, for example, in PTLs 1 and 2. PTL 1 discloses an electrostatic chuck including: one gas inlet that extends through the center of a ceramic plate in a thickness direction; four gas distributing grooves that are provided in the wafer placement surface so as to extend radially from the gas inlet; and discharge openings that are provided in the vicinity of an outer periphery of the ceramic plate so as to respectively communicate with the gas distributing grooves. PTL 2 discloses an electrostatic chuck in which a ceramic plate is divided into two semicircular zones when the ceramic plate is seen from above and a gas groove is provided for each of the semicircular zones. To be specific, in one semicircular zone, a gas flows from a gas inlet provided in the vicinity of an outer periphery of the ceramic plate and passes through cutout portions of a plurality of partition walls that are shaped like concentric circles, and then the gas flows into a gas discharge opening provided at the center of the ceramic plate. In the other semicircular zone, a gas flows from another gas inlet provided in the vicinity of an outer periphery of the ceramic plate and passes through cutout portions of the plurality of partition walls that are shaped like concentric circles, and then the gas flows into the same gas discharge opening provided at the center of the ceramic plate. The gas that flows in the one semicircular zone and the gas that flows in the other semicircular zone are not separated completely, and become mixed on the way.

CITATION LIST

Patent Literature

PTL 1: Japanese Unexamined Patent Application Publication No. 10-275854
PTL 2: Japanese Unexamined Patent Application Publication No. 2012-129547

SUMMARY OF THE INVENTION

However, with PTL 1, it is not possible to individually control a gas for each of the gas distributing grooves, because gases that flow through the four gas distributing grooves have been supplied to the same gas inlet. With PTL 2, it is not possible to individually control a gas for each of the zones, because a gas that flows in the one semicircular zone and a gas that flows in the other semicircular zone become mixed together on the way.

The present invention has been made in order to solve such a problem, and the main object of the present invention is to make it possible to individually control a backside gas of an electrostatic chuck for each of zones.

An electrostatic chuck of the present invention includes: a disk-shaped ceramic plate having a wafer placement surface on a surface thereof; an electrostatic electrode embedded in the ceramic plate; and gas grooves that are divided in a plurality of zones when the ceramic plate is seen from above and each of which is independently provided in the wafer placement surface so as to extend from one to the other of a pair of gas supply/discharge openings for a corresponding one of the zones.

In the electrostatic chuck, the gas grooves are independently provided in the wafer placement surface so as to each extend from one to the other of a pair of gas supply/discharge openings for a corresponding one of the zones. The gas grooves are each used to supply a gas (backside gas) to the back side of a wafer placed on the wafer placement surface. Because the gas grooves are each independently provided for a corresponding one of the zones, it is possible to individually control the backside gas of the electrostatic chuck for each of the zones.

In the electrostatic chuck according to the present invention, the plurality of zones may include two or more annular zones that are concentric with the ceramic plate and that are provided outside of a circular protrusion that is concentric with the ceramic plate. By doing so, it is possible to individually control a gas that flows in each of the annular zone. In this case, the pairs of gas supply/discharge openings each of which is provided for a corresponding one of the gas grooves may be arranged in a predetermined radial direction of the ceramic plate, and a direction of a gas that flows through one of two gas grooves that are provided in adjacent zones may be set to be clockwise and a direction of a gas that flows through the other of the two gas grooves may be set to be counterclockwise. By doing so, for example, it is possible to suppress occurrence of a temperature distribution caused by gases when gases having the same temperature are supplied to the two gas grooves provided in the adjacent zones.

In the electrostatic chuck according to the present invention, the plurality of zones may be a plurality of sectoral zones that are separated by radii of the ceramic plate. By doing so, it is possible to individually control a gas that flows in each of the plurality of sectoral zones.

In the electrostatic chuck according to the present invention, the plurality of zones may be a plurality of curved zones that are separated by curves that extend from a center toward an outer edge of the ceramic plate. By doing so, it is possible to individually control a gas that flows in each of the plurality of curved zones.

In the electrostatic chuck according to the present invention, the gas grooves each of which is provided for a corresponding one of the zones may be respectively capable of being supplied with gases that differ in characteristics. By doing so, it is possible to supply a gas that is suitable for each of the zones. Examples of "characteristics" include temperature, flow rate, pressure, and gas type.

In the electrostatic chuck according to the present invention, a pattern in which a gas is supplied to each of the gas grooves provided for a corresponding one of the zones may be selectable between a first pattern in which the gas flows from one to the other of the pair of gas supply/discharge openings and a second pattern in which the gas flows from the other to the one of the pair of gas supply/discharge openings. By doing so, it is possible to determine whether to cause a gas to flow in the first pattern or to cause a gas to flow in the second pattern in each of gas grooves.

The electrostatic chuck according to the present invention may include a resistance heating element that is embedded in the ceramic plate so as to extend from one to the other of a pair of terminals for each of the zones. By doing so, it is possible to individually control to what degree each of the zones is heated.

BRIEF DESCRIPTION OF THE DRAWINGS

FIG. 6 illustrates a gas passage 78a connected to a gas groove 25a.

FIG. 7 illustrates the gas passage 78a connected to the gas groove 25a.

FIG. 8 illustrates the gas passage 78a connected to the gas groove 25a.

DETAILED DESCRIPTION OF THE INVENTION

Figure 1:
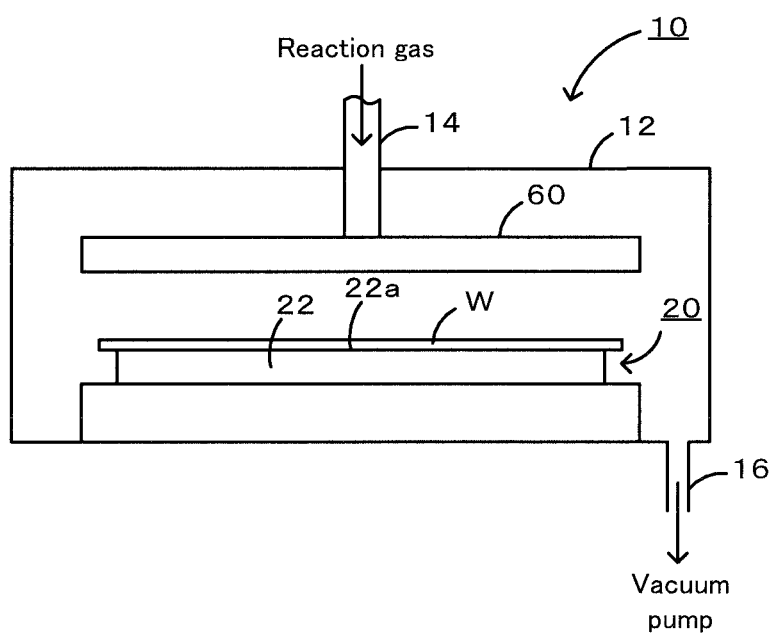
FIG. 1 is a schematic view of a plasma processing apparatus 10.
Figure 2:
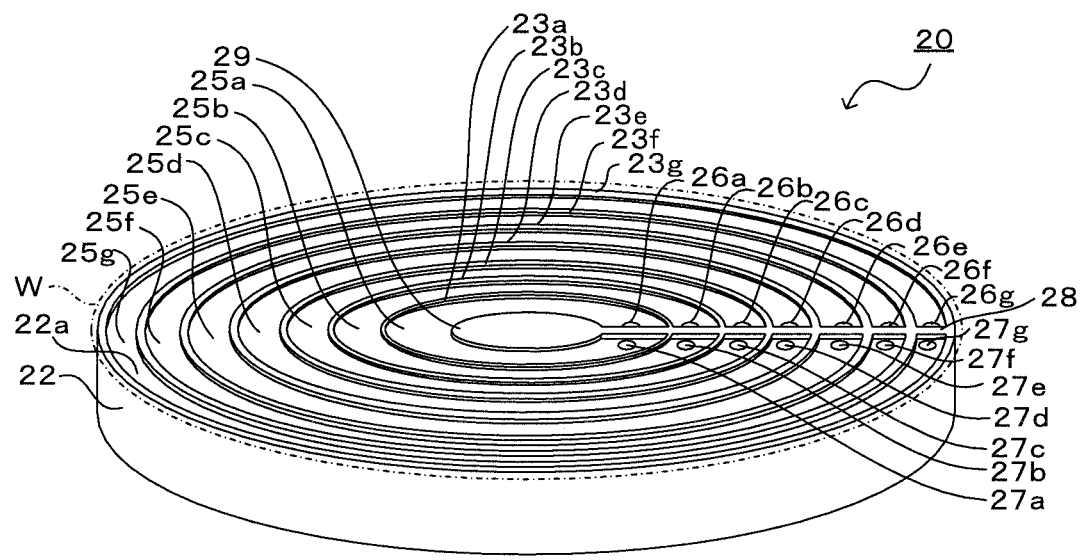
FIG. 2 is a perspective view of an electrostatic chuck 20.
Figure 3:
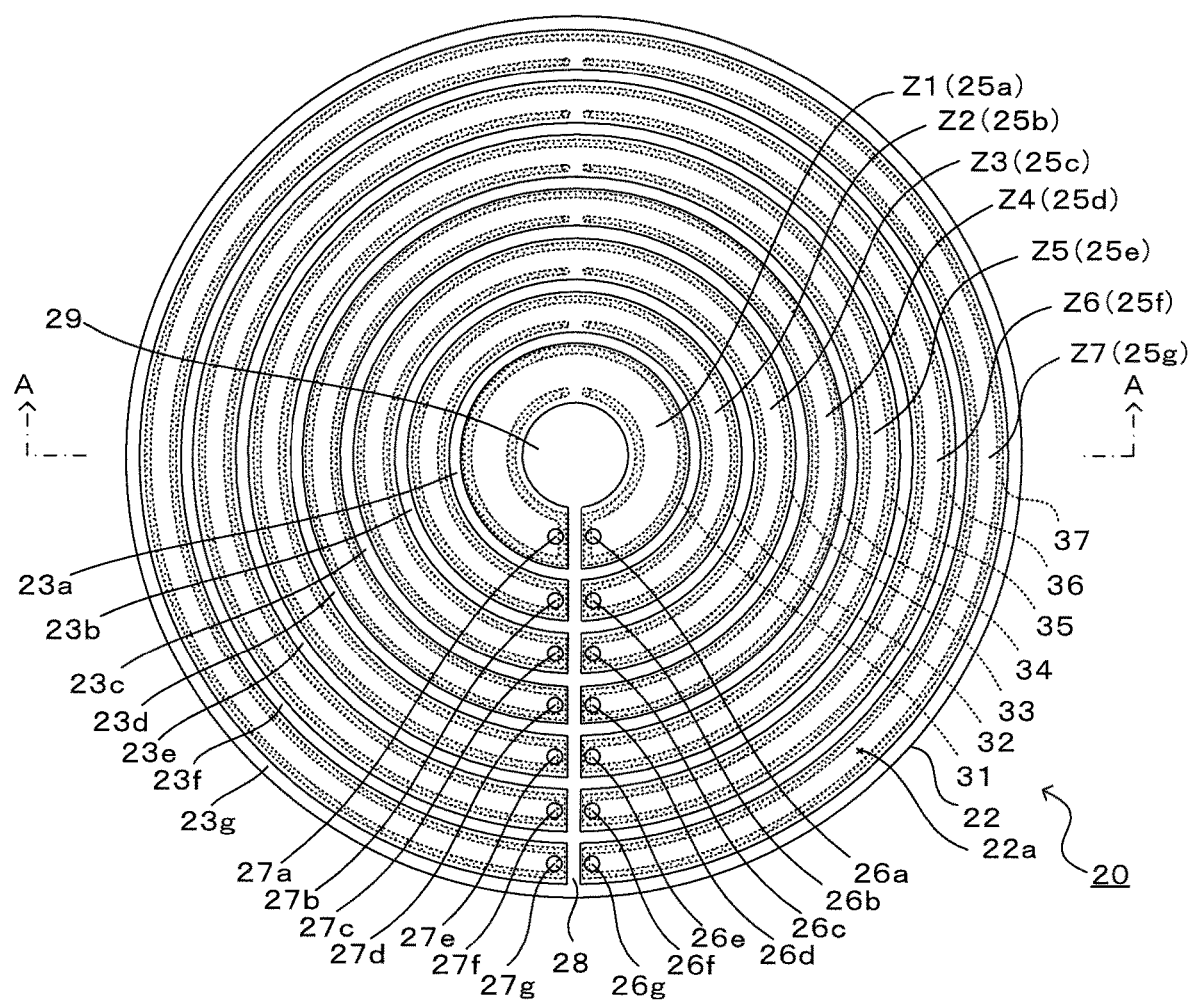
FIG. 3 is a plan view of the electrostatic chuck 20.
Figure 4:
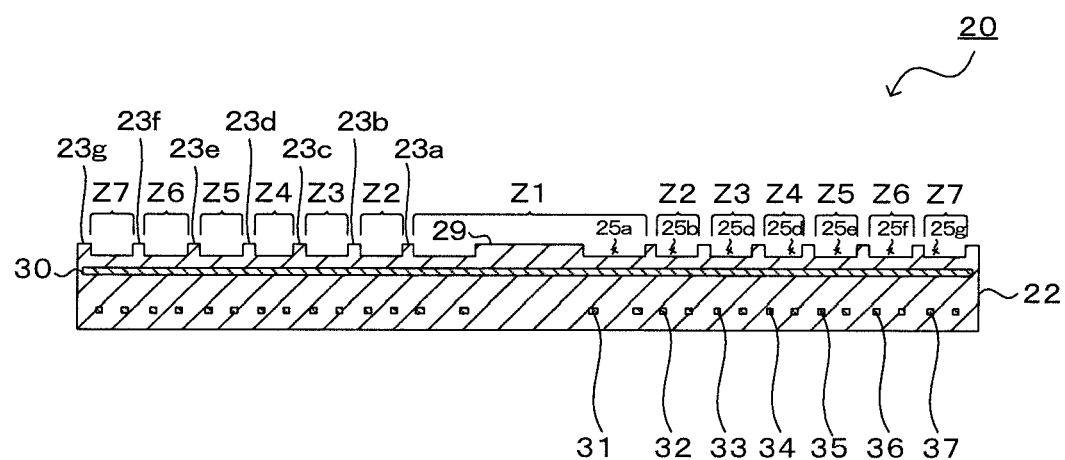
FIG. 4 is a sectional view taken along line A-A of FIG. 3.
Figure 5:
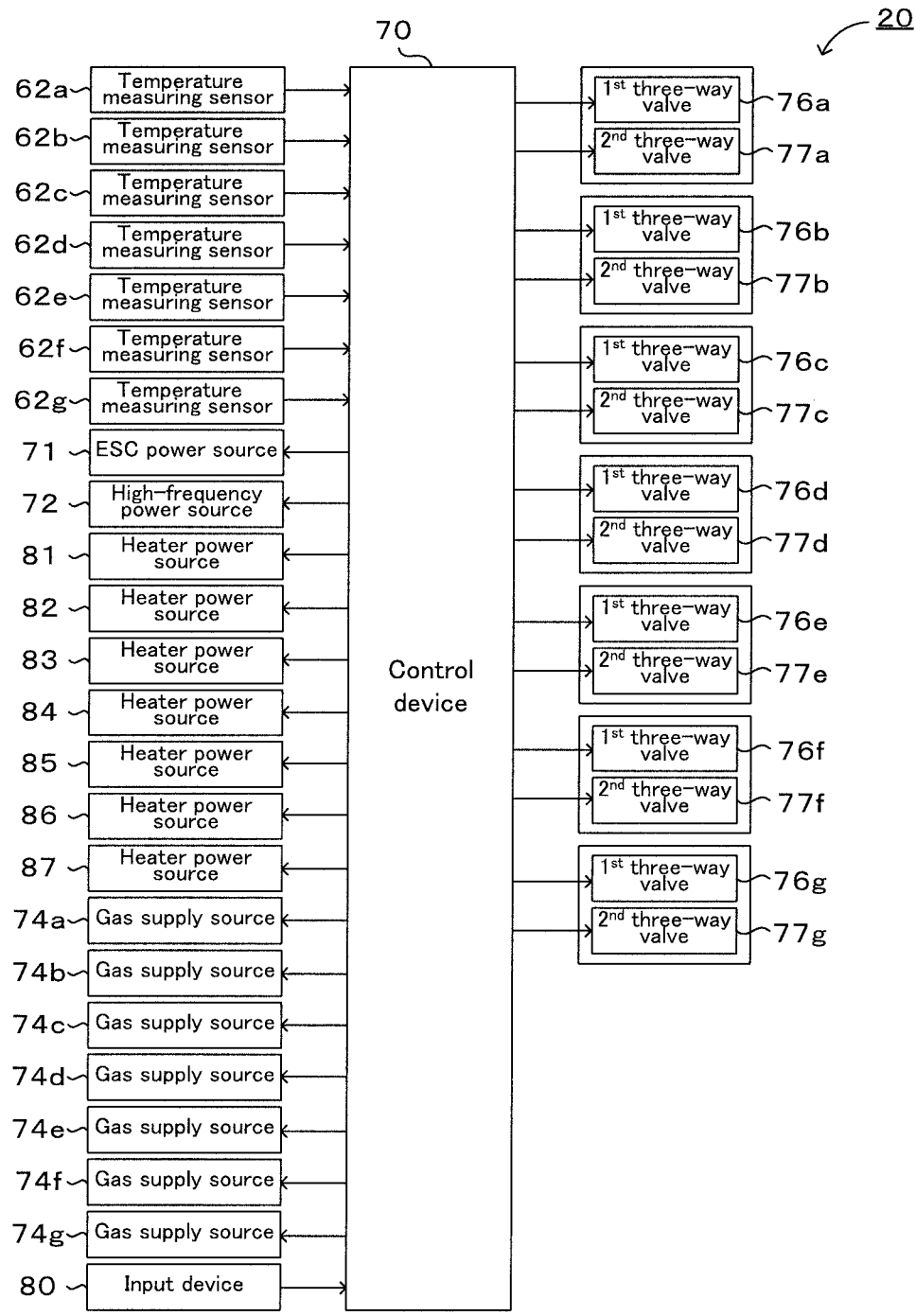
FIG. 5 illustrates electrical connection of the electrostatic chuck 20.

Preferred embodiments of the present invention will be described below with reference to the drawings. FIG. 1 is a schematic view of a plasma processing apparatus 10, FIG. 2 is a perspective view of an electrostatic chuck 20, FIG. 3 is a plan view of the electrostatic chuck 20, FIG. 4 is a sectional view taken along line A-A of FIG. 3, and FIG. 5 illustrates electrical connection of the electrostatic chuck. In FIG. 3, for convenience, resistance heating elements 31 to 37 are shown by hatching. In the following description, "up", "down", "left", "right", "front", and "back" only indicate a relative positional relationship.

As illustrated in FIG. 1, in the plasma processing apparatus 10, the electrostatic chuck 20 and an upper electrode 60 that is used when generating plasma are disposed inside a vacuum chamber 12 that is made of a metal (such as an aluminum alloy) and whose internal pressure is adjustable. The electrostatic chuck 20 is disposed inside the vacuum chamber 12. A large number of small holes, for supplying a reaction gas to a wafer surface, are formed in a surface of the upper electrode 60 facing the electrostatic chuck 20. The vacuum chamber 12 is capable of introducing the reaction gas from a reaction gas inlet path 14 to the upper electrode 60 and is capable of reducing the internal pressure of the vacuum chamber 12 to a predetermined degree of vacuum by using a vacuum pump connected to a gas discharge passage 16.

The electrostatic chuck 20 includes: a ceramic plate 22 having a wafer placement surface 22a, which can attract and hold a wafer W, on an upper surface thereof; an electrostatic electrode 30 (see FIG. 4) embedded in the ceramic plate 22; and the resistance heating elements 31 to 37 (see FIGS. 3 and 4) embedded in the ceramic plate 22. The ceramic plate 22 is a disk-shaped plate that is made of a ceramic (such as alumina or aluminum nitride) and whose outside diameter is smaller than the outside diameter of the wafer W.

As illustrated in FIGS. 2 to 4, the wafer placement surface 22a includes a circular protrusion 29 that is concentric with the ceramic plate 22 and annular protrusions 23a to 23g that are concentric with the ceramic plate 22 so as to surround the circular protrusion 29. The wafer placement surface 22a includes a partition wall 28. The partition wall 28 extends linearly and radially from a position near the center of the ceramic plate 22, connects the circular protrusion 29 and the annular protrusion 23a, and connects adjacent pairs of the annular protrusions 23a to 23g to each other. The wafer W placed on the wafer placement surface 22a is supported by the circular protrusion 29, the annular protrusions 23a to 23g, and an upper surface of the partition wall 28.

The wafer placement surface 22a of the ceramic plate 22 is divided into zones Z1 to Z7 when seen from above (see FIGS. 3 and 4). The zone Z1 is a region inside of the annular protrusion 23a. That is, the zone Z1 is a circular zone that is concentric with the ceramic plate 22. The zone Z1 has a C-shaped gas groove 25a in a region outside of the circular protrusion 29. In the gas groove 25a, a pair of supply/discharge openings 26a and 27a, through which a gas is supplied to or discharged from the zone Z1, are provided. The supply/discharge opening 26a is provided at one end of the C-shaped gas groove 25a (in the vicinity of the partition wall 28), and the supply/discharge opening 27a is provided at the other end of the C-shaped gas groove 25a (in the vicinity of the partition wall 28). The zone Z2 is a region between the annular protrusion 23a and the annular protrusion 23b, the zone Z3 is a region between the annular protrusion 23b and the annular protrusion 23c, the zone Z4 is a region between the annular protrusion 23c and the annular protrusion 23d, the zone Z5 is a region between the annular protrusion 23d and the annular protrusion 23e, the zone Z6 is a region between the annular protrusion 23e and the annular protrusion 23f, and the zone Z7 is a region between the annular protrusion 23f and the annular protrusion 23g. That is, the zones Z2 to Z7 are annular zones that are provided outside of the zone Z1 so as to be concentric with the ceramic plate 22. The zones Z2 to Z7 have C-shaped gas grooves 25b to 25g respectively corresponding thereto. The gas grooves 25b to 25g are provided in substantially the entire regions of the zones Z2 to Z7 respectively corresponding thereto. In the C-shaped gas grooves 25b to 25g, the supply/discharge openings 26b to 26g are respectively provided at one ends, and the supply/discharge openings 27a to 27g are respectively provided at the other ends. The partition wall 28 is positioned between the supply/discharge openings 26a to 26g and the supply/discharge openings 27a to 27g. The supply/discharge openings 26a to 26g and the supply/discharge openings 27a to 27g are both arranged along the partition wall 28. Therefore, the pairs of the supply/discharge openings 26a to 26g and 27a to 27g are arranged in a predetermined radial direction of the ceramic plate 22.

The electrostatic electrode 30 is a planar electrode to which a direct-current voltage can be applied by an ESC power source 71 illustrated in FIG. 5, and is disposed parallel to the wafer placement surface 22a. When a voltage is applied to the electrostatic electrode 30, the wafer W is attracted and held on the wafer placement surface 22a by a Coulomb force or a Johnson-Rahbek force. When application of the direct-current voltage is stopped, the wafer W is stopped from being attracted and held on the wafer placement surface 22a.

The resistance heating elements 31 to 37 are resistance heating elements that are each formed in a one-stroke pattern on the same plane parallel to the wafer placement surface 22a so as to respectively correspond to the zones Z1 to Z7. Terminals provided at both ends of the resistance heating element 31 are connected to a heater power source 81 illustrated in FIG. 5 via power feed members (not shown) that are inserted from the back surface of the ceramic plate 22. When a voltage of the heater power source 81 is applied to the resistance heating element 31, the resistance heating element 31 generates heat to heat the zone Z1. The other resistance heating elements 32 to 37 are respectively and individually connected to heater power sources 82 to 87, and, when a voltage is applied, the other resistance heating elements 32 to 37 individually heat the zones Z2 to Z7. The resistance heating elements 31 to 37 are made of, for example, an electroconductive material including W, WC, Mo, or the like. The shape of the resistance heating elements 31 to 37 is not particularly limited, and may have, for example, a coil-like shape or a ribbon-like shape. The resistance heating elements 31 to 37 may be printed paste of an electroconductive material.

A control device 70 includes a known microcomputer including a CPU, a ROM, a RAM, and the like. As illustrated in FIG. 5, signals output from temperature measuring sensors 62a to 62g and an instruction input by an operator from an input device 80 (a keyboard or a mouse) are input to the control device 70. The temperature measuring sensors 62a to 62g measure temperatures at positions respectively corresponding to the gas grooves 25a to 25g. The control device 70 outputs electric power to the electrostatic electrode 30 via the ESC power source 71, and outputs electric power to the resistance heating elements 31 to 37 via the heater power source 81 to 87. Moreover, the control device 70 controls gas supply sources 74a to 74g to change the types, the temperatures, and the flow rates of gases supplied to the gas grooves 25a to 25g, and controls three-way valves 76a to 76g and 77a to 77g to control the directions of gases that flow through the gas grooves 25a to 25g. Alternative-current electric power can be supplied to the electrostatic electrode 30. When generating plasma, a high-frequency voltage can be applied to the electrostatic electrode 30 via a high-frequency power source 72.

Figure 6:
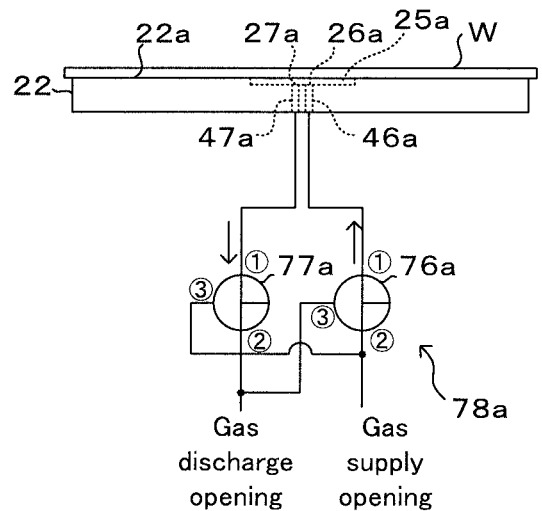
Figure 7:
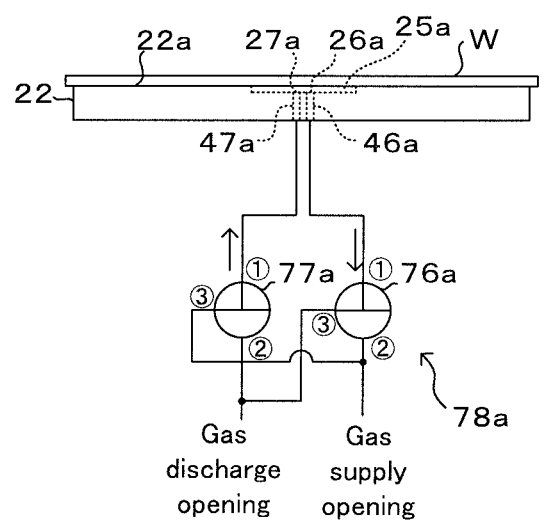
Figure 8:
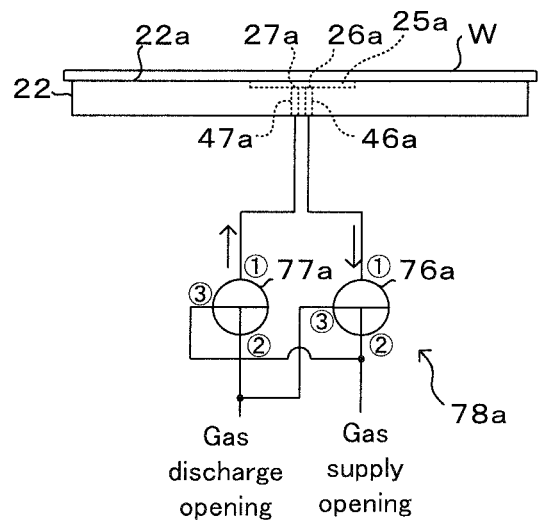

Here, a case of controlling the directions of gases that flow through the gas grooves 25a to 25g will be described. In the following description, the gas groove 25a will be used as an example. FIGS. 6 to 8 illustrate a gas passage 78a connected to the gas groove 25a. The ceramic plate 22 has through-holes 46a and 47a extending through the ceramic plate 22 in a thickness direction. The through-holes 46a and 47a respectively communicate with the supply/discharge openings 26a and 27a provided in the gas groove 25a. The through-hole 46a is connected to a first three-way valve 76a. The through-hole 47a is connected to a second three-way valve 77a. Among three ports of the first three-way valve 76a, a first port is coupled to the through-hole 46a, a second port is coupled to a gas supply opening, and a third port is coupled to a middle part of a gas pipe that connects a gas discharge opening and the second three-way valve 77a. Among three ports of the second three-way valve 77a, a first port is coupled to the through-hole 47a, a second port is coupled to the gas discharge opening, and a third port is coupled to a middle part of a gas pipe that connects the gas supply opening and the first three-way valve 76a. In FIGS. 6 to 8, encircled numbers 1 to 3 indicate the first to third ports of the three-way valve.

By adjusting the positions of the first and second three-way valves 76a and 77a, the pattern in which a gas is supplied to the gas groove 25a is selectable between a first pattern in which the gas flows from the supply/discharge opening 26a to the supply/discharge opening 27a and a second pattern in which the gas flows from the supply/discharge opening 27a to the supply/discharge opening 26a.

To be specific, in order to supply the gas from the supply/discharge opening 26a, cause the gas to flow through the gas groove 25a counterclockwise in FIG. 3, and cause the gas to be discharged from the supply/discharge opening 27a, the first and second three-way valves 76a and 77a are adjusted as follows. That is, as illustrated in FIG. 6, the first three-way valve 76a is adjusted so that the first port of the first three-way valve 76a communicates with the second port and the third port is blocked, and the second three-way valve 77a is adjusted so that the first port of the second three-way valve 77a communicates with the second port and the third port is blocked.

In order to supply the gas from the supply/discharge opening 27a, cause the gas to flow through the gas groove 25a clockwise in FIG. 3, and cause the gas to be discharged from the supply/discharge opening 26a, the first and second three-way valves 76a and 77a are adjusted as follows. That is, as illustrated in FIG. 7, the first three-way valve 76a is adjusted so that the first port of the first three-way valve 76a communicates with the third port and the second port is blocked, and the second three-way valve 77a is adjusted so that the first port of the second three-way valve 77a communicates with the third port and the second port is blocked.

In order to fill the gas groove 25a with the gas (to cause the gas to be contained in the gas groove 25a), the first and second three-way valves 76a and 77a are adjusted as follows. That is, as illustrated in FIG. 8, the first three-way valve 76a is adjusted so that the first port of the first three-way valve 76a is blocked and second port communicates with the third port, and the second three-way valve 77a is adjusted so that the first port of the second three-way valve 77a is blocked and the second port communicates with the third port. In this case, the gas supply source 74a may be stopped.

The directions of gases that flow through the gas groove 25b to 25g can be controlled by adjusting the first three-way valves 76b to 76g and the second three-way valve 77b to 77g in the same way as with the gas groove 25a.

Next, an example of use of the plasma processing apparatus 10 thus configured will be described. First, in a state in which the electrostatic chuck 20 is set in the vacuum chamber 12, a wafer W is placed on the wafer placement surface 22a of the ceramic plate 22. Then, the inside of the vacuum chamber 12 is depressurized to a predetermined degree of vacuum by using a vacuum pump, a direct-current voltage is applied to the electrostatic electrode 30 of the ceramic plate 22 to generate a Coulomb force or a Johnson-Rahbek force, so that the wafer W is attracted and held on the wafer placement surface 22a of the ceramic plate 22. Thus, the gas grooves 25a to 25g and the wafer W form a gas space. Next, the inside of the vacuum chamber 12 is made to be a reaction gas atmosphere of a predetermined pressure (for example, in the range of several tens to several hundreds of Pa), and, in this state, a high-frequency voltage is applied between the upper electrode 60 in the vacuum chamber 12 and the electrostatic electrode 30 of the ceramic plate 22 to generate plasma. Then, the surface of the wafer W is etched by the generated plasma. In performing etching, a target temperature T of the wafer W is set beforehand. The control device 70 adjusts voltages applied to the resistance heating elements 31 to 37 of the respective zones Z1 to Z7 and adjusts the orientations and the characteristics (the temperatures, the flow rates, the pressures, the gas types, and the like) of gasses that flow through the gas grooves 25a to 25g of the respective zones Z1 to Z7 so that the output values of the temperature measuring sensors 62a to 62g coincide with the target temperature T. As described above, the orientations of the gases that flow through the gas grooves 25a to 25g can be changed by adjusting the first and second three-way valves 76a to 76g and 77a to 77g. The temperatures, the flow rates, the pressures, and the gas types of the gases can be changed by controlling the gas supply sources 74a to 74g.

If a hot spot is generated in the wafer W, the heat of the hot spot is efficiently released to the ceramic plate 22 by introducing a gas having a low temperature or by supplying a gas having a high thermal conductivity (for example, He gas) into the gas groove of a zone corresponding to the hot spot. Alternatively, the charged pressure of a gas supplied to the gas groove may be increased. Alternatively, the amount of heat to be generated may be reduced by reducing electric power supplied to the resistance heating element of a zone corresponding to the hot spot.

On the other hand, if a cool spot is generated in the wafer W, the heat of the cool spot is prevented from easily released to the ceramic plate 22 by introducing a gas having a high temperature, by increasing the flow rate of a gas, or by supplying a gas having a low thermal conductivity (for example, Ar gas) into the gas groove of a zone corresponding to the cool spot. Alternatively, the charged pressure of a gas supplied to the gas groove may be reduced. Alternatively, the amount of heat to be generated may be increased by increasing electric power supplied to the resistance heating element of a zone corresponding to the cool spot.

When it is desirable to suppress occurrence of a temperature distribution caused by a gas, the flow paths of gases are switched by using the three-way valves 76a, 77a, 76c, 77c, 76e, 77e, 76g, and 77g so that the directions of gases that flow through the gas grooves 25a, 25c, 25e, and 25g become a first pattern. In addition, the flow paths of gases are switched by using the three-way valves 76a, 77a, 76c, 77c, 76e, 77e, 76g, and 77g so that the directions of gases that flow through the gas grooves 25b, 25d, and 25f become a second pattern. By doing so, heat exchange is performed between gases that flow in adjacent zones, and gases having a uniform temperature flow through the gas grooves 25a to 25g.

In the electrostatic chuck 20 described above in detail, the gas grooves 25a to 25g are independently provided in the wafer placement surface 22a so as to extend from one to the other of a pair of gas supply/discharge openings for each of the zones. The gas grooves 25a to 25g are each used to supply a gas (backside gas) to the backside of the wafer W placed on the wafer placement surface 22a. Because the gas grooves 25a to 25g are independently provided in the respective zones Z1 to Z7, it is possible to individually control the backside gas of the electrostatic chuck 20 for each of the zones Z1 to Z7.

The electrostatic chuck 20 includes the circular zone Z1 that is concentric with the ceramic plate 22, and the annular zones Z2 to Z7 that are disposed outside of the zone Z1. Therefore, it is possible to individually control a gas that flows in each of the circular zone Z1 or the annular zones Z2 to Z7. Moreover, the direction of a gas that flows through one of two gas grooves that are provided in adjacent zones can be set to be clockwise, and the direction of a gas that flows through the other of the two gas grooves can be set to be counterclockwise. Therefore, for example, it is possible to suppress occurrence of a temperature distribution caused by gases when gases having the same temperature are supplied to the two gas grooves provided in adjacent zones.

Moreover, with the electrostatic chuck 20, it is possible to supply gases having different temperatures, flow rates, pressures, and gas types to the gas groove 25a to 25f provided so as to correspond to the zones Z1 to Z7. Therefore, it is possible to supply a gas having characteristics suitable for each of the zones.

With the electrostatic chuck 20, a pattern of supplying a gas to each of the gas grooves 25a to 25g is selectable between a first pattern in which the gas flows from the supply/discharge opening 26 to the supply/discharge opening 27 and a second pattern in which the gas flows from the supply/discharge opening 27 to the supply/discharge opening 26. Therefore, it is possible to determine whether to cause a gas to flow in the first pattern or in the second pattern in each of the gas grooves.

In the electrostatic chuck 20, the resistance heating elements 31 to 37 corresponding to the zones Z1 to Z7 are embedded in the ceramic plate 22. Therefore, it is possible to individually control to what degree each of the zones Z1 to Z7 is heated.

The present invention is not in any way limited to the above-described embodiment, and the present invention can be carried out in a variety of forms as long as the forms belong to the technical scope of the present invention.

Figure 9:
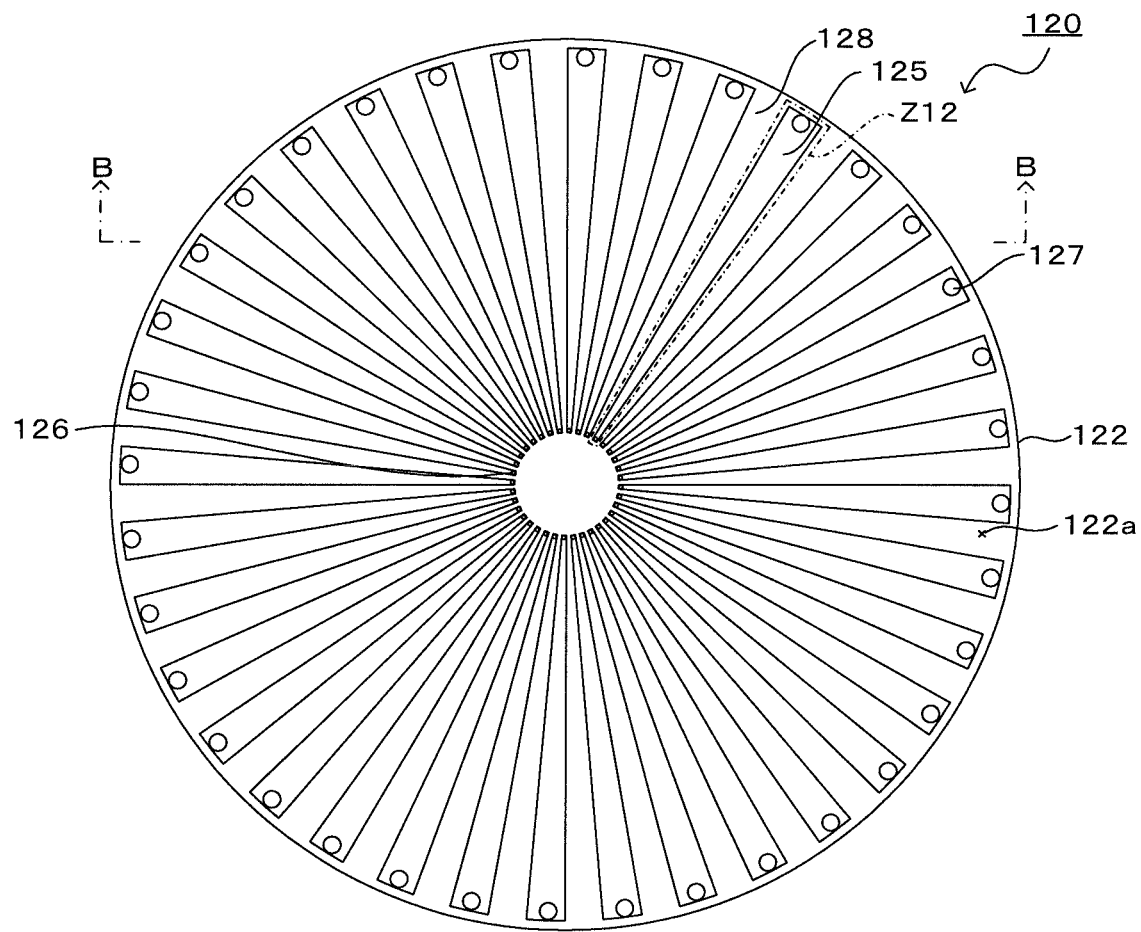
FIG. 9 is a plan view of an electrostatic chuck 120.
Figure 10:
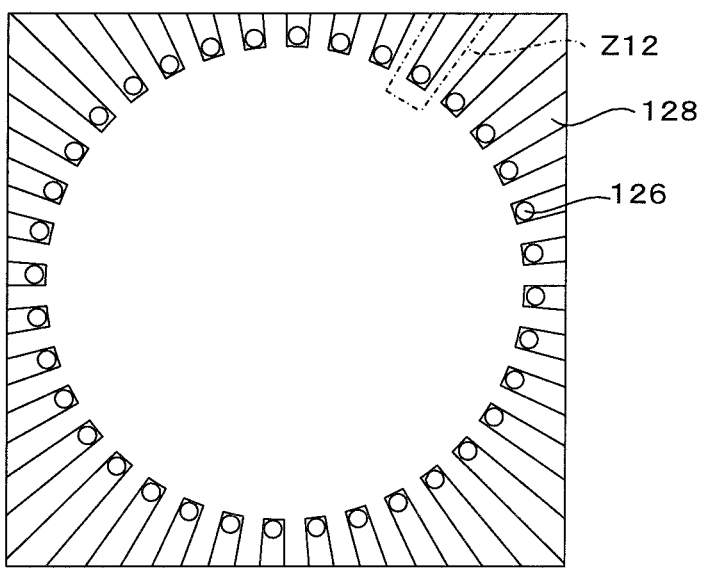
FIG. 10 is a partial enlarged view of FIG. 9.
Figure 11:
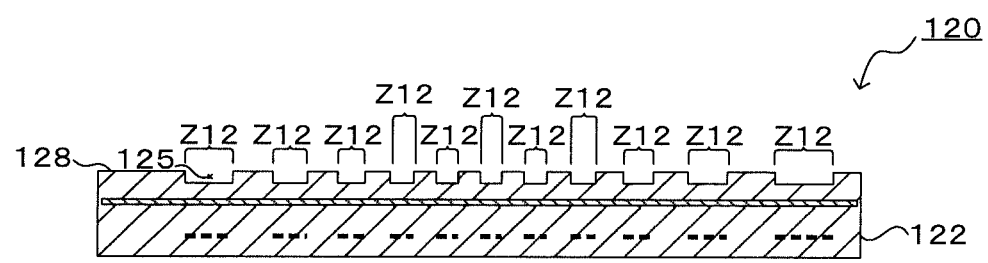
FIG. 11 is a sectional view taken along line B-B of FIG. 9.

For example, in the embodiment described above, the wafer placement surface 22a is divided into the circular zone Z1 and the annular zones Z2 to Z7 as seen from above. However, the present invention is not limited to this. For example, as in an electrostatic chuck 120 illustrated in FIGS. 9 to 11, a wafer placement surface 122a of a ceramic plate 122 may be divided into a plurality of sectoral zones Z12 that are separated by radii of the ceramic plate 122 as seen from above. Each zone Z12 includes a sectoral gas groove 125 in substantially the entire region thereof. A supply/discharge opening 126 is provided on the central side of each gas groove 125, and a supply/discharge opening 127 is provided on the outer peripheral side of each gas groove 125. Between each adjacent pair of the zones Z12, a partition wall 128, which extends from the central side toward the outer peripheral side of the wafer placement surface 122a, is provided. It is possible to independently supply a gas to each of the gas grooves 125. By doing so, it is possible to individually control gases that flow in the plurality of zones Z12.

Figure 12:
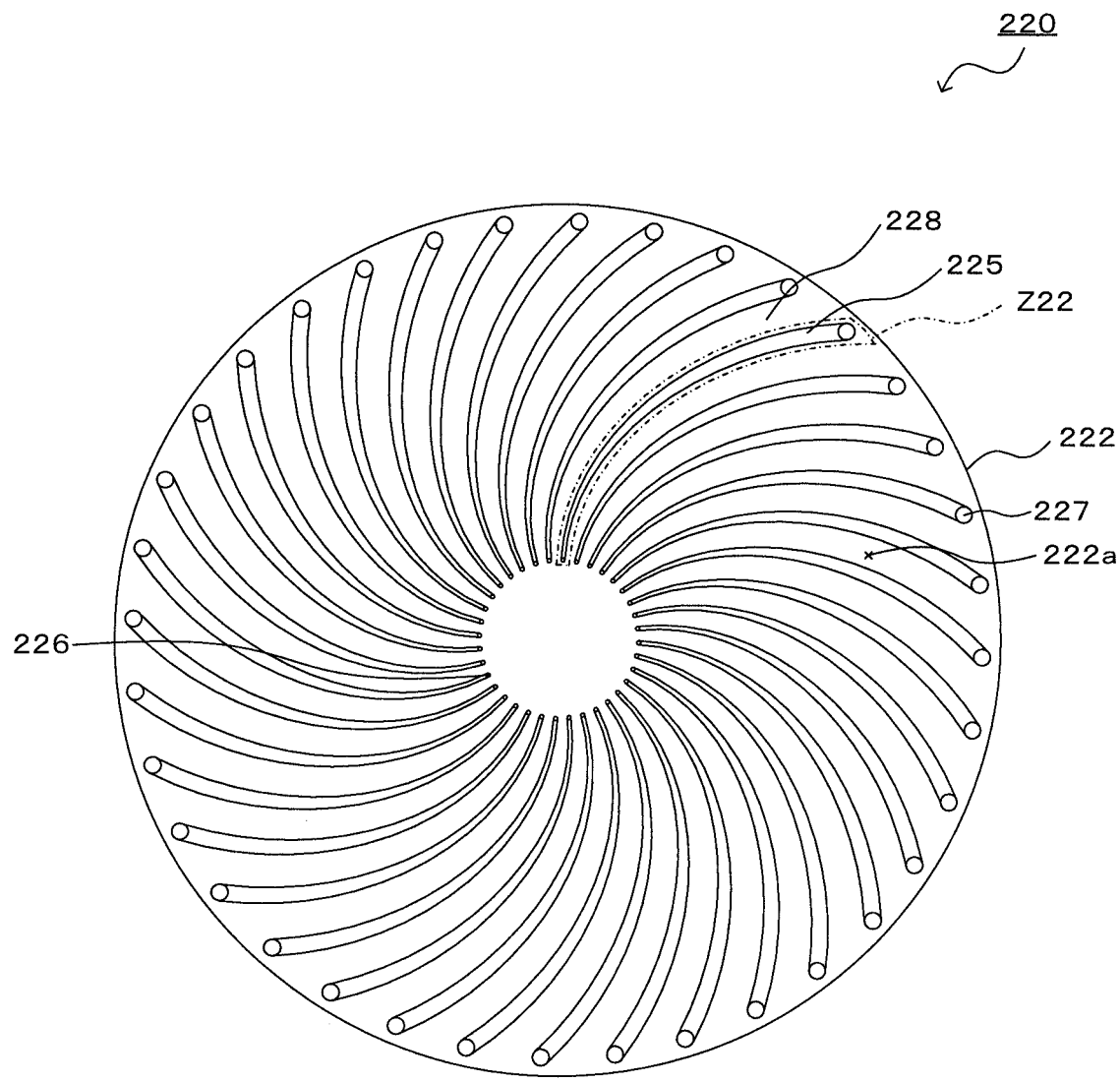
FIG. 12 is a sectional view of an electrostatic chuck 220.

Alternatively, as in an electrostatic chuck 220 illustrated in FIG. 12, a wafer placement surface 222a of a ceramic plate 222 may be divided into a plurality of curved zones Z22 that are separated by curves that extend from the center toward the outer edge of the ceramic plate 222. Each zone Z22 includes a curved gas groove 225 in substantially the entire region thereof. A supply/discharge opening 226 is provided on the central side of each gas groove 225, and a supply/discharge opening 227 is provided on the outer peripheral side of each gas groove 225. Between each adjacent pair of the zones Z22, a partition wall 228, which extends from the central side toward the outer peripheral side of the wafer placement surface 222a and which are curved from the central side toward the outer peripheral side, is provided. It is possible to independently supply a gas to each of the gas grooves 225. By doing so, it is possible to individually control gases that flow in the plurality of zones Z22.

In the embodiment described above, the resistance heating elements 31 to 37 are embedded in the ceramic plate 22. However, the resistance heating elements 31 to 37 need not be embedded. In this case, the temperature of the wafer W is controlled mainly by using gases that flow through the gas grooves 25a to 25g.

In the embodiment described above, a cooling plate made of a metal (such as aluminum or an aluminum alloy) may be bonded or joined to the back surface of the electrostatic chuck 20. A coolant flow path, through which a coolant (such as cooling water) circulates, may be provided inside the cooling plate. It becomes possible to control the temperature of the wafer W also by using the coolant.

The present application claims priority from Japanese Patent Application No. 2020-090932, filed on May 25, 2020, the entire contents of which are incorporated herein by reference.

What is claimed is:

1. An electrostatic chuck comprising:
a disk-shaped ceramic plate having a wafer placement surface on a surface thereof;
an electrostatic electrode embedded in the ceramic plate; and
gas grooves that are divided in a plurality of zones when the ceramic plate is seen from above and each of which is independently provided in the wafer placement surface so as to extend from one to the other of a pair of gas supply/discharge openings for a corresponding one of the zones,
wherein a pattern in which a gas is supplied to each of the gas grooves provided for a corresponding one of the zones is selectable between a first pattern in which the gas flows from one to the other of the pair of gas supply/discharge openings and a second pattern in which the gas flows from the other to the one of the pair of gas supply/discharge openings.

2. The electrostatic chuck according to claim 1,
wherein the plurality of zones include two or more annular zones that are concentric with the ceramic plate and that are provided outside of a circular protrusion that is concentric with the ceramic plate.

3. The electrostatic chuck according to claim 2,
wherein the pairs of gas supply/discharge openings each of which is provided for a corresponding one of the gas grooves are arranged in a predetermined radial direction of the ceramic plate, and a direction of a gas that flows through one of two gas grooves that are provided in adjacent zones is set to be clockwise and a direction of a gas that flows through the other of the two gas grooves is set to be counterclockwise.

4. The electrostatic chuck according to claim 1,
wherein the plurality of zones are a plurality of sectoral zones that are separated by radii of the ceramic plate.

5. The electrostatic chuck according to claim 1,
wherein the plurality of zones are a plurality of curved zones that are separated by curves that extend from a center toward an outer edge of the ceramic plate.

6. The electrostatic chuck according to claim 1,
wherein the gas grooves each of which is provided for a corresponding one of the zones are respectively capable of being supplied with gases that differ in characteristics.

7. The electrostatic chuck according to claim 1, comprising:
a resistance heating element that is embedded in the ceramic plate so as to extend from one to the other of a pair of terminals for each of the zones.

8. An electrostatic chuck comprising:
a disk-shaped ceramic plate having a wafer placement surface on a surface thereof;
an electrostatic electrode embedded in the ceramic plate; and
gas grooves that are divided in a plurality of zones when the ceramic plate is seen from above and each of which is independently provided in the wafer placement surface so as to extend from one to the other of a pair of gas supply/discharge openings for a corresponding one of the zones,
wherein the plurality of zones include two or more annular zones that are concentric with the ceramic plate and that are provided outside of a circular protrusion that is concentric with the ceramic plate, and
wherein the pairs of gas supply/discharge openings each of which is provided for a corresponding one of the gas grooves are arranged in a predetermined radial direction of the ceramic plate, and a direction of a gas that flows through one of two gas grooves that are provided in adjacent zones is set to be clockwise and a direction of a gas that flows through the other of the two gas grooves is set to be counterclockwise.

9. The electrostatic chuck according to claim 8,
wherein the gas grooves each of which is provided for a corresponding one of the zones are respectively capable of being supplied with gases that differ in characteristics.

10. The electrostatic chuck according to claim 8, comprising:
a resistance heating element that is embedded in the ceramic plate so as to extend from one to the other of a pair of terminals for each of the zones.

* * * * *